(12) United States Patent
Knopik et al.

(10) Patent No.: US 12,270,842 B2
(45) Date of Patent: *Apr. 8, 2025

(54) METHOD AND DEVICE FOR DETECTING THE PHASE OF A SIGNAL VIA A HYBRID COUPLER, USING A REFERENCE PHASE

(71) Applicants:CENTRE NATIONAL DE LA RECHERCHE SCIENTIFIQUE, Paris (FR); STMicroelectronics France, Montrouge (FR); UNIVERSITE DE BORDEAUX, Bordeaux (FR); INSTITUT POLYTECHNIQUE DE BORDEAUX, Talence (FR)

(72) Inventors: Vincent Knopik, Crets en Belledonne (FR); Jeremie Forest, Villard Bonnot (FR); Eric Kerherve, Pessac (FR)

(73) Assignees: STMicroelectronics France, Montrouge (FR); CENTRE NATIONAL DE LA RECHERCHE SCIENTIFIQUE, Paris (FR); UNIVERSITE DE BORDEAUX, Bordeaux (FR); INSTITUT POLYTECHNIQUE DE BORDEAUX, Talence (FR)

( * ) Notice: Subject to any disclaimer, the term of this patent is extended or adjusted under 35 U.S.C. 154(b) by 501 days.

This patent is subject to a terminal disclaimer.

(21) Appl. No.: 17/421,801

(22) PCT Filed: Jan. 22, 2019

(86) PCT No.: PCT/FR2019/050137
§ 371 (c)(1),
(2) Date: Jul. 9, 2021

(87) PCT Pub. No.: WO2020/152400
PCT Pub. Date: Jul. 30, 2020

(65) Prior Publication Data
US 2022/0099718 A1 Mar. 31, 2022

(51) Int. Cl.
*G01R 25/04* (2006.01)
*H04B 17/21* (2015.01)

(52) U.S. Cl.
CPC ............ *G01R 25/04* (2013.01); *H04B 17/21* (2015.01)

(58) Field of Classification Search
CPC .... G01R 25/04; G01R 31/389; G01R 31/392; G01R 31/396; G01R 31/382; H04B 17/21;
(Continued)

(56) References Cited

U.S. PATENT DOCUMENTS 5,610,564 A 3/1997 Tomasini et al.
9,397,675 B1 7/2016 Goodson
(Continued)

FOREIGN PATENT DOCUMENTS

CN 102714499 A 10/2012
CN 107037282 A 8/2017
(Continued)

OTHER PUBLICATIONS

Aryanfar, Farshid et al., "An Amplitude-based Phase Detector at MM-Wave Frequency Range", IEEE Microwave Symposium Digest, Sunnyvale, CA, Jun. 5, 2011, 4 pages, XP032006933.
(Continued)

*Primary Examiner* — Raul J Rios Russo
*Assistant Examiner* — Trung Q Nguyen
(74) *Attorney, Agent, or Firm* — Slater Matsil, LLP

(57) ABSTRACT

In an embodiment method for detecting the phase of an analog signal via a hybrid coupler operating in a power-combiner mode, the hybrid coupler comprises a first input intended to receive the analog signal, a second input intended to receive a reference signal having a reference phase and the same frequency as the analog signal, and two
(Continued)

outputs, and is configured to generate, at these two outputs, a first output signal and a second output signal, respectively. The embodiment method comprises measuring peak values of the analog signal, of the reference signal, and of at least one of the first and second output signals, calculating the phase shift between the phase of the analog signal and the reference phase depending on the measured peak values, and determining the phase of the analog signal depending on the calculated phase shift and the reference phase.

20 Claims, 5 Drawing Sheets

(58) Field of Classification Search
CPC ... H01M 10/48; H01M 10/44; H01M 10/4285
USPC ........... 324/400, 430–433, 500, 600, 764.01, 324/103 R, 771, 761.01, 501, 639, 642, 324/702, 76.11, 76.66, 76.83, 96
See application file for complete search history.

(56) References Cited

U.S. PATENT DOCUMENTS

| | | | |
|---|---|---|---|
| 11,394,101 B2 * | 7/2022 | Knopik | H01L 23/5223 |
| 11,563,424 B2 * | 1/2023 | Forest | G01R 25/04 |
| 11,641,217 B2 * | 5/2023 | Forest | H04B 1/18 |
| | | | 455/130 |
| 2004/0145416 A1 * | 7/2004 | Kwon | H03F 1/02 |
| | | | 330/296 |
| 2005/0156780 A1 * | 7/2005 | Bonthron | G01S 3/48 |
| | | | 342/134 |
| 2013/0157601 A1 | 6/2013 | O'Keefee et al. | |
| 2017/0126181 A1 | 5/2017 | Embar | |
| 2017/0201019 A1 | 7/2017 | Trotta | |
| 2018/0019722 A1 | 1/2018 | Birkbeck | |
| 2020/0350653 A1 * | 11/2020 | Knopik | H01P 5/12 |

FOREIGN PATENT DOCUMENTS

| | | | |
|---|---|---|---|
| EP | 2456090 A1 | 5/2012 | |
| JP | 2018059745 * | 4/2018 | G01S 5/06 |
| JP | 2018059745 A | 4/2018 | |
| KR | 101449610 B1 | 10/2014 | |
| WO | 2011090767 A2 | 7/2011 | |
| WO | 2017023688 A1 | 2/2017 | |
| WO | 2018109871 A1 | 6/2018 | |

OTHER PUBLICATIONS

Ridgway, Richard W. et al., "Data Transmission Using Differential Phase-Shift Keying on a 92 GHz Carrier", IEEE Transaction on Microwave Theory and Techniques, vol. 58, No. 11, Nov. 2010, 10 pages.

Aryanfar, Farshid, "An Amplitude-based Phase Detector at MM-Wave Frequency Range," Published in IEEE MTT-S International Microwave Symposium, Date of Conference Jun. 5-10, 2011, 4 pages.

Juan, Su et al., "Design of Pound-Drever-Hall Laser Frequency Stabilization System Using the Quadrature Demodulation," English abstract, Chinese Journal of Lasers, vol. 43, No. 3, Mar. 2016, 6 pages.

Chinese Search Report, Application No. 2019800898561, Oct. 24, 2024, 3 pages.

* cited by examiner

1

METHOD AND DEVICE FOR DETECTING THE PHASE OF A SIGNAL VIA A HYBRID COUPLER, USING A REFERENCE PHASE

CROSS-REFERENCE TO RELATED APPLICATIONS

This application is a national phase filing under section 371 of PCT/FR2019/050137, filed on Jan. 22, 2019, which is hereby incorporated herein by reference in its entirety.

TECHNICAL FIELD

Implementations and embodiments of the invention relate to electronic devices and methods, and more particularly to phase-detecting electronic devices and methods.

BACKGROUND

Generally, the objective of a phase-detecting electronic device, or in other words a phase detector, is to generate an output signal proportional to the phase difference between two input signals.

SUMMARY

A conventional phase-detecting electronic device generally comprises either analog components such as analog multipliers, or digital circuits such as logic gates or flip-flops.

However, such an electronic device is not suitable for electromagnetic applications in the radio-frequency (RF) domain and in particular in the millimeter-band domain.

There is thus a need to provide a technical solution of low complexity that will allow the phase of an analog signal to be detected in very high frequency electromagnetic applications without requiring substantial modifications to the electronic circuits used in such applications.

According to one aspect, a method for detecting the phase of an analog signal via a hybrid coupler operating in a power-combiner mode is proposed.

The hybrid coupler comprises a first input that receives the analog signal, a second input that receives a reference signal having a reference phase and a frequency that is identical to the frequency of the analog signal, and two outputs.

The hybrid coupler generates, on these two outputs, a first output signal and a second output signal, respectively.

The method comprises measuring peak values of the analog signal, of the reference signal, and of at least one of the first and second output signals, calculating the phase shift between the phase of the analog signal and the reference phase from the measured peak values, and determining the phase of the analog signal from the calculated phase shift and from the reference phase.

Such a method based on the use of a hybrid coupler advantageously is intrinsically suitable for very high frequency electromagnetic applications.

Furthermore, for transmission paths comprising hybrid couplers, such a method advantageously enables a non-invasive solution of low complexity.

By virtue of the intrinsic features of the hybrid coupler, when the hybrid coupler operating in the power-combiner mode receives, at its inputs, the analog signal and the reference signal having the same frequency, respectively, at its outputs first and second signals are obtained that depend on the amplitudes of the analog signal and of the reference signal, and on the phase shift between the analog signal and the reference signal.

In other words, the peak value of the first or of the second output signal depends on the peak values of the analog signal and of the reference signal, and on the phase shift between the analog signal and the reference signal.

Thus, once the peak values of the first or of the second output signal, of the analog signal, and of the reference signal have been measured, it is possible to calculate the phase shift between the analog signal and the reference signal from the measured peak values.

As the reference signal has a known or preset reference phase, it is thus possible to determine the phase of the analog signal from the calculated phase shift and from the reference phase.

According to one implementation, the hybrid coupler has a coupling factor the value of which is chosen between 0.8 and 1.0, and the calculated phase shift is between −75° and 75°.

It should be noted that this embodiment takes into account the imperfection of the hybrid coupler and allows a reliable calculated phase shift to be obtained. Such a range of the calculated phase shift advantageously makes it possible to obtain a satisfactory correspondence with an actually measured phase shift.

By way of nonlimiting example, the hybrid coupler may be a 90° hybrid coupler.

In other words, the hybrid coupler may, for example, be a conventional quadrature hybrid coupler generally comprising a first input terminal, a so-called isolated second input terminal coupled to an impedance, for example of 50 ohms, when the coupler is operating in power-divider mode, or a so-called coupled second input terminal when the coupler is operating in power-combiner mode, or a so-called direct second input terminal when the coupler is operating in phase-shifter mode, a so-called transmitted first output terminal, and a so-called coupled second output terminal when the coupler is operating in power-divider mode and in phase-shifter mode, or a so-called isolated second output terminal, connected to an impedance, for example of 50 ohms, when the coupler is operating in power-combiner mode.

According to another aspect, a method for adjusting the phase of an analog signal via a hybrid coupler operating in a power-combiner mode is proposed. This adjusting method comprises the method for detecting the phase of the analog signal such as defined above so as to obtain the determined phase of the analog signal, a comparison between a setpoint phase and the determined phase of the analog signal, and an adjustment, if the setpoint phase and the determined phase of the analog signal are different, of the phase of the analog signal until equality is obtained between the setpoint phase and the phase of the analog signal to within a tolerance.

Advantageously, such a method allows the phase of the analog signal to be adjusted depending on a setpoint phase once the phase of the analog signal has been determined, this being very useful, in particular during a calibration phase.

It should be noted that a person skilled in the art will be able to choose a suitable tolerance depending for example on the envisioned application. By way of nonlimiting indication, the tolerance may for example be about 5%.

According to another aspect, an electronic device for detecting the phase of an analog signal is proposed. This device comprises a hybrid coupler configured to operate in a power-combiner mode.

The hybrid coupler comprises a first input intended to receive the analog signal, a second input intended to receive a reference signal having a reference phase and a frequency that is identical to the frequency of the analog signal, and two outputs.

The hybrid coupler is configured to generate, at these two outputs, a first output signal and a second output signal, respectively.

The device furthermore comprises measuring circuit configured to measure peak values of the analog signal, of the reference signal, and of at least one of the first and second output signals, and processing circuit configured to determine the phase shift between the analog signal and the reference signal from the measured peak values, and the phase of the analog signal from the calculated phase shift and from the reference phase.

According to one embodiment, the hybrid coupler has a coupling factor the value of which is chosen between 0.8 and 1.0 and the calculated phase shift is between −75° and 75°.

According to yet another embodiment, the hybrid coupler is a 90° hybrid coupler.

According to another aspect, a device for adjusting the phase of an analog signal via a hybrid coupler configured to operate in a power-combiner mode is proposed.

This adjusting device comprises a device for detecting the phase of the analog signal such as defined above so as to obtain the determined phase of the analog signal, adjusting circuit coupled to the hybrid coupler, and configured to deliver to the first input the analog signal and to the processing circuit a setpoint signal having a setpoint phase.

The processing circuit of the detecting device is furthermore configured to compare the setpoint phase and the determined phase of the analog signal, and adjust, if the setpoint phase and the determined phase of the analog signal are different, the phase of the analog signal via the adjusting circuit until equality is obtained between the setpoint phase and the determined phase of the analog signal to within a tolerance.

According to one embodiment, the adjusting circuit comprises an emitting module configured to deliver the analog signal and to adjust, under control by the processing circuit, the determined phase of the analog signal depending on the setpoint phase.

According to another embodiment, the adjusting circuit comprises an emitting module configured to deliver the setpoint signal and the analog signal, and a phase shifter coupled between the emitting module and the first input and configured to adjust, under control by the processing circuit, the determined phase of the analog signal depending on the setpoint phase.

According to another aspect, a structure is proposed. This structure comprises an adjusting electronic device such as defined above, an output device comprising a complementary hybrid coupler configured to operate in a power-combiner mode, and a coupling stage coupled between the adjusting electronic device and the output electronic device.

This structure may for example form a balanced power amplifier, such amplifiers being commonly known in the art.

According to yet another aspect, a communication apparatus incorporating at least one structure such as defined above is proposed.

BRIEF DESCRIPTION OF THE DRAWINGS

Other advantages and features of the invention will become apparent on examining the detailed description of completely nonlimiting embodiments and implementations, and the appended drawings in which.

DETAILED DESCRIPTION OF ILLUSTRATIVE EMBODIMENTS

Figure 1:
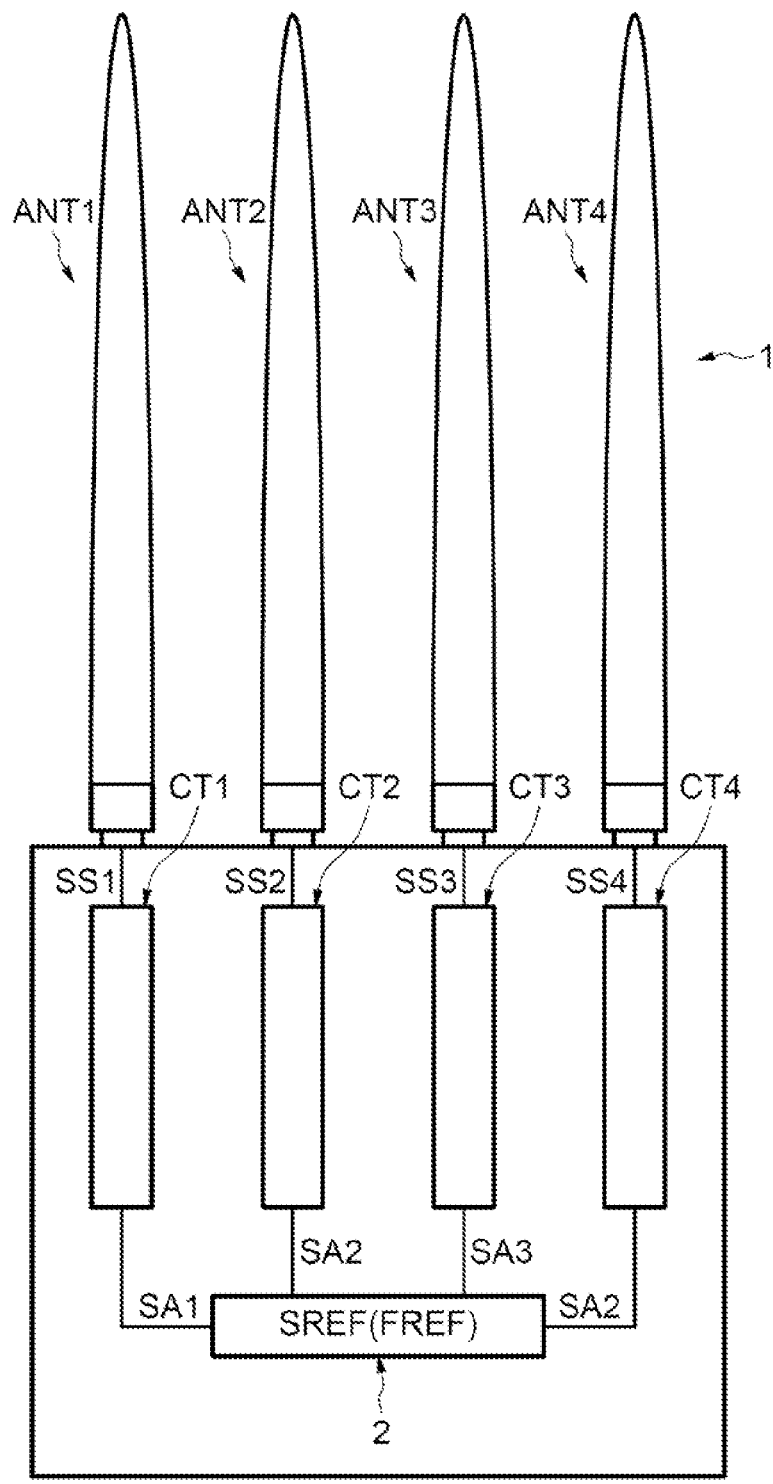
FIG. 1 illustrates a Wi-Fi communication apparatus.

The reference 1 in FIG. 1 designates a communication apparatus, here for example a communication apparatus of the Wi-Fi router type according to the standards of the IEEE 802.11 group.

By way of nonlimiting example, this communication apparatus 1 employs beamforming technology to achieve directional emission of signals.

This apparatus 1 comprises an emitting module 2, here for example a transceiver 2 configured to generate N analog signals SA1, SA2, SA3, SA4 (N is an integer number equal to or higher than two, here N is for example equal to 4), and N antennas ANT1, ANT2, ANT3, ANT4 coupled to the transceiver 2 via four transmission paths CT1, CT2, CT3, CT4, respectively.

Each analog signal SA1, SA2, SA3, SA4 is generated from a reference signal SREF having a reference frequency FREF and each analog signal SA1, SA2, SA3, SA4 is intended to have a preset phase shift with respect to the reference signal SREF.

The frequencies of the analog signals and of the reference signal are identical.

In general, the transceiver 2 is configured to control the phase and the amplitude of each analog signal SA1, SA2, SA3, SA4 dedicated to the corresponding transmission path CT1, CT2, CT3, CT4.

After signal-processing operations carried out by each transmission path CT1, CT2, CT3, CT4, each antenna ANT1, ANT2, ANT3, ANT4 is configured to emit an output signal SS1, SS2, SS3, SS4 having a corresponding preset phase shift.

As a result, a pattern of constructive and destructive interference may be formed in the wave front. On reception, the information originating from the various antennas ANT1, ANT2, ANT3, ANT4 is combined in such a way that the expected signal is revealed.

It should be noted that the performance of the directional emission of these analog signals SA1, SA2, SA3, SA4 is highly dependent on the precision of the phase shifts of these analog signals SA1, SA2, SA3, SA4.

Thus, it is advantageous to make provision, in each transmission path CT1, CT2, CT3, CT4, to detect and optionally adjust the phase of the analog signal SA1, SA2, SA3, SA4 so as to ensure the performance of the directional emission is satisfactory.

An example embodiment of one of the transmission paths CT1, CT2, CT3, CT4, here for example the first transmission path CT1, of the communication apparatus 1, will now be described in more detail with reference to FIG. 2.

The first transmission path CT1 is coupled between the transceiver 2 and the first antenna ANT1 and comprises an output electronic device DES1 coupled to the first antenna ANT1, and a coupling stage EC1 coupled between the input and output electronic devices DEE1, DES1.

Together, the input and output electronic devices DEE1, DES1 and the coupling stage EC1 form a balanced power amplifier.

The input electronic device DEE1 comprises a first hybrid coupler CH1, here for example a 90° quadrature hybrid coupler, comprising a first input terminal BE1 coupled to the transceiver 2 and intended to receive the first analog signal SA1, a so-called isolated, coupled second input terminal BE2, coupled to an impedance, for example of 50 ohms, when the coupler is operating in power-divider mode, or a so-called coupled second input terminal BE2 when the coupler is operating in power-combiner mode, a first output terminal BS1, and a second output terminal BS2.

The output electronic device DES1 comprises a second hybrid coupler CH2, here also a 90° quadrature hybrid coupler, operating in power-combiner mode and comprising a third input terminal BE3, a fourth input terminal BE4, a so-called isolated, coupled third output terminal BS3, coupled to an impedance, for example of 50 ohms, and a fourth output terminal BS4 coupled to the first antenna ANT1 and configured to deliver, to the first antenna ANT1, the first output signal SS1.

The coupling stage EC1 comprises a first coupling module MC1 coupled in parallel between the first output terminal BS1 and the third input terminal BE3, and a second coupling module MC2 coupled in parallel between the second output terminal BS2 and the fourth input terminal BE4.

The first coupling module MC1 here for example comprises a first driver stage and a first power controller that are coupled in series between the first output terminal BS1 and the third input terminal BE3.

The second coupling module MC2 comprises a second driver stage and a second power controller that are coupled in series between the second output terminal BS2 and the fourth input terminal BE4.

By way of nonlimiting indication, when the first transmission path CT1 is in use, the first hybrid coupler CH1 operates in power-divider mode and the second hybrid coupler CH2 operates in power-combiner mode.

In order to ensure that the phase of the first analog signal SA1 received at the first input terminal BE1 corresponds to a first setpoint phase PC1, the first transmission path CT1 is furthermore configured to detect and adjust the phase of the first analog signal SAL An example of a method for detecting and adjusting the phase of the first analog signal SA1 will now be described with reference to FIG. 3 as well.

To do this, the first transmission path CT1 operates in a detection or adjustment mode and the first hybrid coupler CH1 operates in power-combiner mode.

The second input terminal BE2 is, in this detection or adjustment mode, intended to receive a reference signal SREF having the same frequency as the frequency of the first analog signal SA1 and a known reference phase. The second input terminal BE2 is here for example intended to receive the reference signal SREF.

The first transmission path CT1 comprises a first measuring circuit MM1 comprising a first peak detector DC1 coupled to the first input terminal BE1 and configured to measure the peak value A1 of the first analog signal SA1, a second peak detector DC2 coupled to the second input terminal BE2 and configured to measure the peak value A2 of the reference signal SREF, a third peak detector DC3 coupled to the first output terminal BS1 and configured to measure the peak value A3 of a first output signal SS1 delivered by the first hybrid coupler CH1 to the first output terminal BS1, and a fourth peak detector DC4 coupled to the second output terminal BS2 and configured to measure the peak value A4 of a second output signal SS2 delivered by the second hybrid coupler CH2 to the second output terminal BS2.

The structures of the first, second, third and fourth peak detectors DC1, DC2, DC3, DC4 are common knowledge to those skilled in the art and each peak detector DC1, DC2, DC3, DC4 may for example comprise an amplifier mounted in a follower configuration, a diode and a capacitor (not illustrated).

In this first step STP1, the first measuring circuit MM1 is configured to measure the peak values A1, A2, A3, A4.

Figure 3:
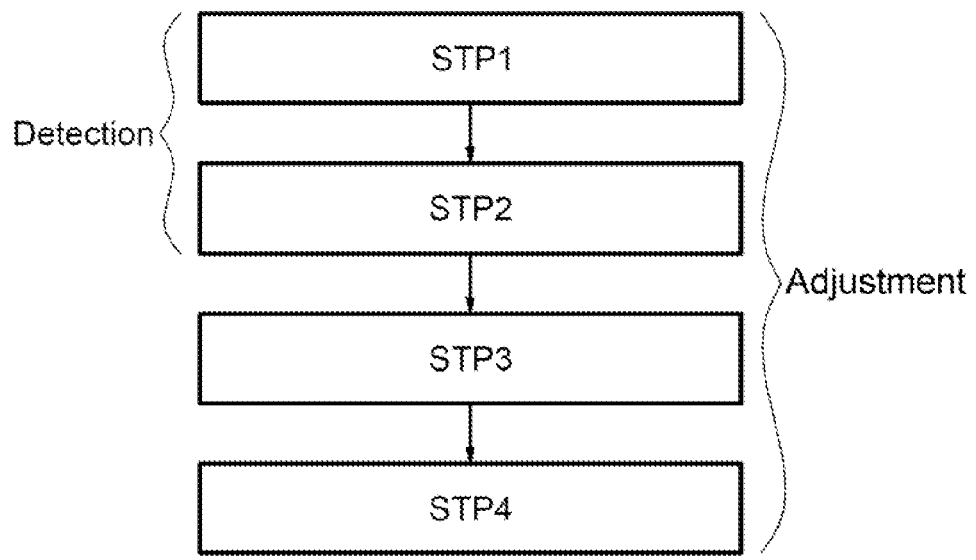
FIG. 3 illustrates a method for adjusting a phase of an analog signal.

The first transmission path CT1 furthermore comprises a first processing circuit MT1 intended to receive the peak values A1, A2, A3, A4 and configured to calculate the phase of the first analog signal SA1 (STP2 in FIG. 3).

Specifically, the first analog signal SA1 may be described by an equation in the time domain:

$$SA1(t)=A1*\cos(\omega*t+\Phi1),$$

where $\omega$ is the angular frequency of the first analog signal:

$$\omega=2\pi*FREF$$

and $\Phi1$ is the phase of the first analog signal SA1.

The reference signal SREF may be described by another equation in the time domain:

$$SREF(t)=A2*\cos(\omega*t+\Phi2),$$

where $\Phi2$ is the reference phase.

In the same way, the first and second output signals SS1, SS2 may be written as follows:

$$A3=\sqrt{A1^2+A2^2+2*A1*A2*\cos(\Phi1-\Phi2)},$$

$$A4=\sqrt{A1^2+A2^2+2*A1*A2*\cos(\Phi2-\Phi1)}.$$

By isolating $\Phi1-\Phi2$, the following are obtained $$\Phi1-\Phi2 = -\arccos\left(\frac{A3^2 - \frac{A1^2+A2^2}{2}}{A1*A2}\right)+90° \text{ or}$$

$$\Phi1-\Phi2 = \arccos\left(\frac{A4^2 - \frac{A1^2+A2^2}{2}}{A1*A2}\right)-90°$$

Therefore, the phase shift between the first analog signal SA1 and the reference signal SREF is calculated from the peak values A1, A2, A3, A4 of the first analog signal SA1, of the reference signal SREF and of the first or second output signal SS1, SS2.

As the reference phase $\Phi2$ is known, the phase $\Phi1$ of the first analog signal SA1 may thus be calculated by the first processing circuit MT1.

It should be noted that the aforementioned equations are based on an ideal hybrid coupler, in other words one having a coupling factor, known to those skilled in the art, equal to 1.

In real cases, it is preferable to use a hybrid coupler having a coupling factor the value of which is chosen between 0.8 and 1.0. In these cases, the value of a phase shift calculated between −75° and 75° indeed corresponds to the value of the directly measured phase shift.

The transceiver 2 is furthermore coupled to the first processing circuit MT1 and configured to deliver to the first processing circuit MT1 a first setpoint signal SC1 having the first setpoint phase PC1.

The first processing circuit MT1 is furthermore configured to compare the first setpoint phase PC1 and the determined phase Φ1 of the first analog signal SM. (STP3 in FIG. 3).

If the first setpoint phase PC1 and the determined phase Φ1 of the first analog signal SM are different, the transceiver 2 is configured to adjust the phase Φ1 of the first analog signal SM under control by the first processing circuit MT1 so as to align the phase Φ1 and the first setpoint phase PC1 (STP4 in FIG. 3) to within a tolerance.

Thus, a device for detecting and adjusting the phase of an analog signal SM via a hybrid coupler CH1 is obtained, which device forms a solution of low complexity that is non-invasive for electromagnetic applications already comprising in particular one or more hybrid couplers.

Figure 2:
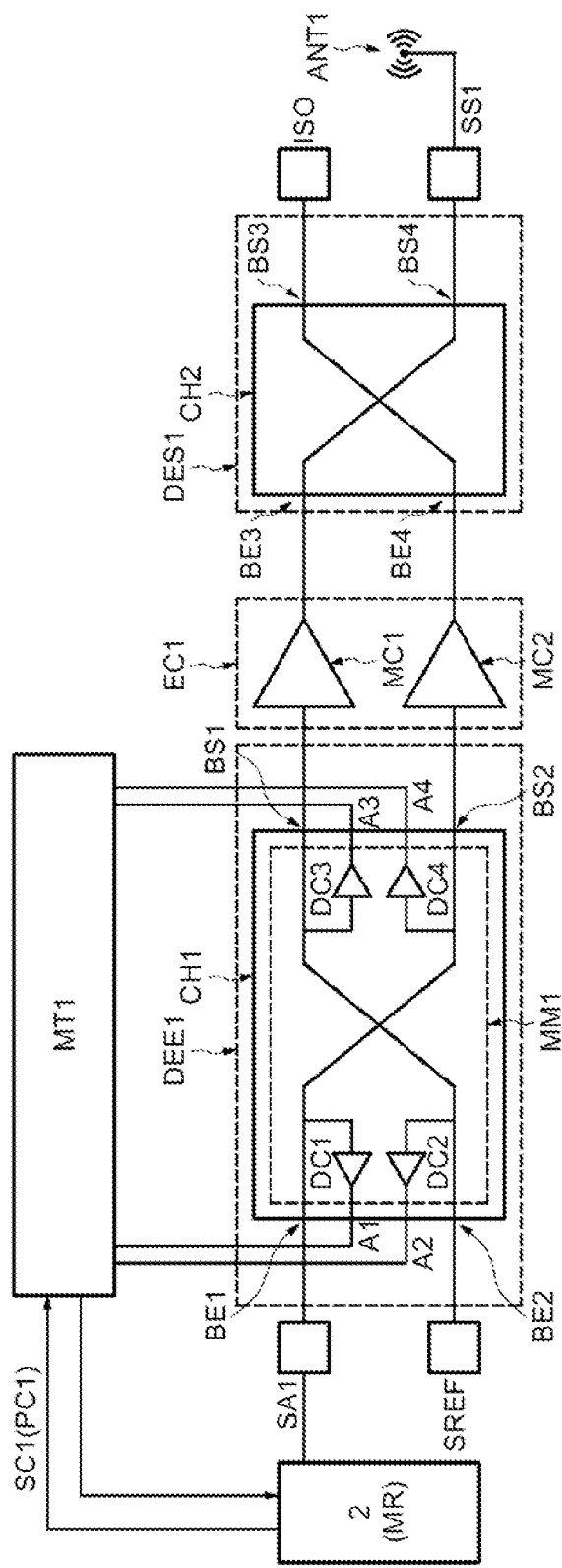
FIG. 2 illustrates a transmission path.

It should be noted that, in the example illustrated in FIG. 2, the transceiver 2 forms an adjusting circuit MR configured to adjust the phase Φ1 of the first analog signal SM under control by the first processing circuit MT1.

As a variant, the phase Φ1 and the first setpoint phase PC1 may be adjusted outside the transceiver 2.

Another example embodiment of the first transmission path CT1 of the communication apparatus 1, and another corresponding example implementation for detecting and adjusting the phase Φ1 of the first analog signal SA1 will now be described with reference to FIG. 4 and FIG. 5, respectively.

Figure 4:
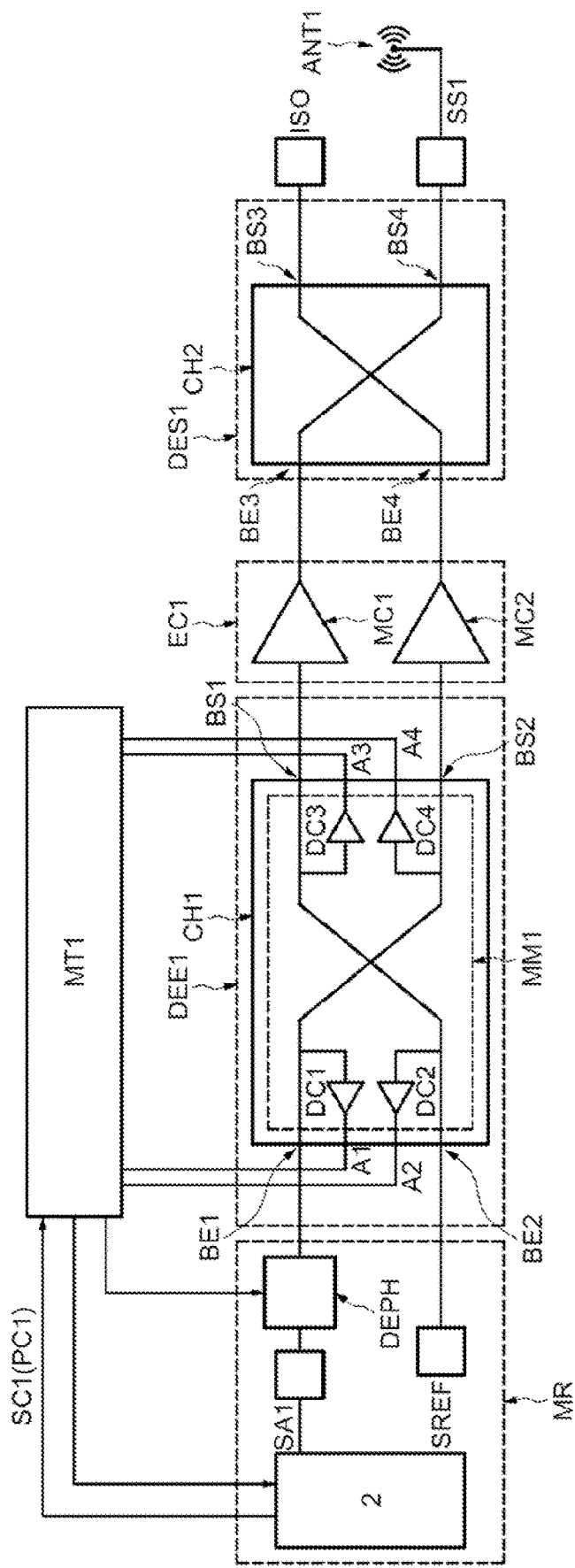
FIG. 4 illustrates another transmission path.
Figure 5:
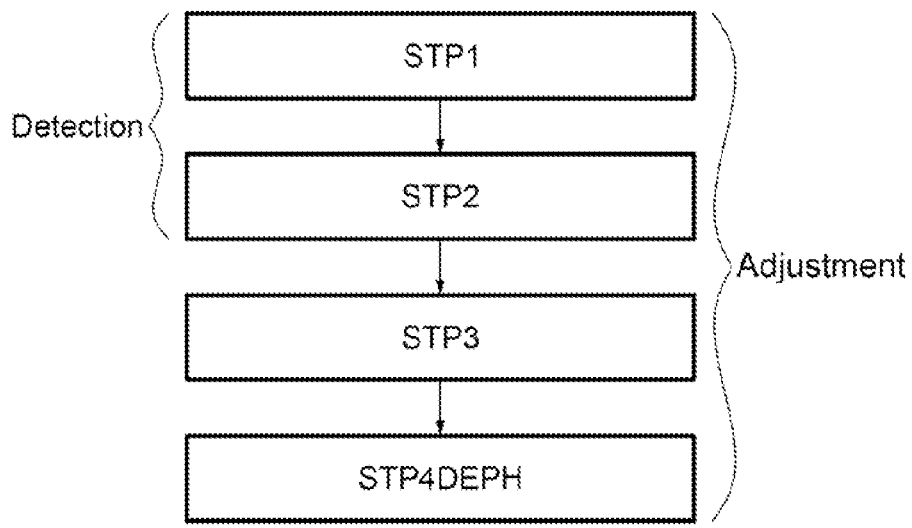
FIG. 5 illustrates another method for adjusting a phase of an analog signal.

The first transmission path CT1 in FIG. 4 is similar to that illustrated in FIG. 2 and more particularly comprises a phase shifter DEPH coupled between the transceiver 2 and the first input terminal BE1 and configured to adjust, under control by the first processing circuit MT1, the phase Φ1 of the first analog signal SA1 delivered by the transceiver 2.

In this case, the adjusting circuit MR comprises the phase shifter DEPH and the transceiver 2.

The method for detecting the phase Φ1 of the first analog signal SA1 carried out by the first transmission path CT1 in FIG. 4 is identical to the method illustrated in FIG. 3 and comprises a first step STP1 in which the first measuring circuit MM1 is configured to measure the peak values A1, A2, A3, A4 of the first analog signal SA1, of the reference signal SREF, and of the first and/or second output signals SS1, SS2, and a second step STP2 in which the first processing circuit MT1 is configured to calculate the phase shift (Φ1-Φ2) between the phase Φ1 and the reference phase Φ2 using one of the two following equations:

$$\Phi 1 - \Phi 2 = -\arccos\left(\frac{A3^2 - \frac{A1^2 + A2^2}{2}}{A1 * A2}\right) + 90° \text{ or}$$

$$\Phi 1 - \Phi 2 = \arccos\left(\frac{A4^2 - \frac{A1^2 + A2^2}{2}}{A1 * A2}\right) - 90°$$

and to determine the phase Φ1 depending on the calculated phase shift Φ1−Φ2 and the reference phase Φ2.

The method for adjusting the phase Φ1 of the first analog signal SA1 carried out by the first transmission path CT1 in FIG. 4 furthermore comprises a third step STP3 in which the first processing circuit MT1 is configured to receive the first setpoint signal SC1 having the first setpoint phase PC1 and to compare the first setpoint phase PC1 with the determined phase Φ1, and a fourth step STP4DEPH in which, if the first setpoint phase PC1 and the determined phase Φ1 are different, the phase shifter DEPH is configured to adjust, under control by the first processing circuit MT1, the determined phase Φ1 of the first analog signal SA1 depending on the first setpoint phase PC1 until equality is obtained between the first setpoint phase PC1 and the determined phase Φ1 of the first analog signal SA1 to within a tolerance.

Figure 6:
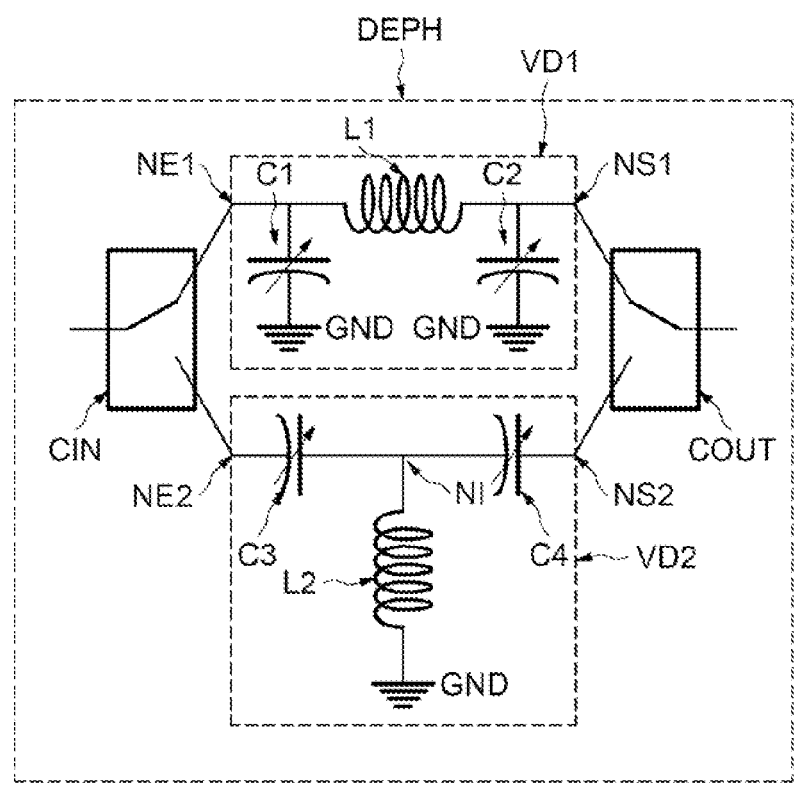
FIG. 6 illustrates a phase shifter.

By way of nonlimiting indication, FIG. 6 illustrates an example embodiment of the phase shifter DEPH.

This phase shifter DEPH comprises a first phase-shifting channel VD1, a second phase-shifting channel VD2, and an input switch CIN coupled to the transceiver 2 and configured to switch between the first phase-shifting channel VD1 and the second phase-shifting channel VD2, an output switch COUT coupled to the first input terminal BE1 and configured to switch between the first and second phase-shifting channels VD1, VD2.

The first phase-shifting channel VD1 comprises a first input node NE1, a first output node NS1, a first inductor L1 coupled between the first input and output nodes NE1 and NS1, a first adjustable capacitor C1 coupled between the first input node NE1 and ground GND, and a second adjustable capacitor C2 coupled between the first output node NS1 and ground GND.

When the phase shifter DEPH is configured to delay, under control by the first processing circuit MT1, the determined phase Φ1 of the first signal SA1, the input switch CIN and the output switch COUT are configured to select the first phase-shifting channel VD1 and to adjust the determined phase Φ1 of the first analog signal SM depending on the first setpoint phase PC1 until equality is obtained between the first setpoint phase PC1 and the determined phase Φ1 of the first analog signal SA1 to within a tolerance.

The second phase-shifting channel VD2 comprises a second input node NE2, a second output node NS2, a third adjustable capacitor C3 coupled between the second input node NE2 and an intermediate node NI, a fourth adjustable capacitor C4 coupled between the second output node NS2 and the intermediate node NI, and a second inductor L2 coupled between the intermediate node NI and ground GND.

When the phase shifter DEPH is configured to advance, under control by the first processing circuit MT1, the determined phase Φ1 of the first signal SA1, the input switch CIN and the output switch COUT are configured to select the second phase-shifting channel VD2 and to adjust the determined phase Φ1 of the first analog signal SA1 depending on the first setpoint phase PC1 until equality is obtained between the first setpoint phase PC1 and the determined phase Φ1 of the first analog signal SA1 to within a tolerance.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

The invention claimed is:

1. A method of operating a hybrid coupler in a power-combiner mode, the method comprising:
   receiving, at a first input of the hybrid coupler, an analog signal having a frequency;
   receiving, at a second input of the hybrid coupler, a reference signal having the frequency of the analog signal with a reference phase;
   measuring, by a measuring circuit, peak values of the analog signal, the reference signal, and at least one of a first output signal and a second output signal provided by two outputs, respectively, of the hybrid coupler;

calculating, by a processing circuit, a phase shift between a phase of the analog signal and the reference phase from the measured peak values; and determining, by the processing circuit, the phase of the analog signal from the calculated phase shift and the reference phase.

2. The method as claimed in claim 1, wherein the hybrid coupler has a coupling factor value of between 0.8 and 1.0, and the calculated phase shift is between −75° and 75°.

3. The method as claimed in claim 2, wherein the hybrid coupler is a 90° hybrid coupler.

4. The method as claimed in claim 1, further comprising:
comparing between a setpoint phase and the determined phase of the analog signal; and
in response to the setpoint phase and the determined phase of the analog signal being different, adjusting the phase of the analog signal until the setpoint phase and the determined phase of the analog signal are equal to within a tolerance.

5. The method as claimed in claim 1, wherein the tolerance is 5%.

6. An electronic device, comprising:
a hybrid coupler configured to operate in a power-combiner mode, the hybrid coupler comprising:
a first input configured to receive an analog signal having a frequency;
a second input configured to receive a reference signal having the frequency of the analog signal with a reference phase; and
two outputs configured to generate a first output signal and a second output signal, respectively;
a measuring circuit configured to measure peak values of the analog signal, the reference signal, and at least one of the first output signal and the second output signal; and
a processing circuit configured to:
calculate a phase shift between the analog signal and the reference signal from the measured peak values; and
calculate a phase of the analog signal from the calculated phase shift and the reference phase.

7. The electronic device as claimed in claim 6, wherein the hybrid coupler has a coupling factor value of between 0.8 and 1.0, and the calculated phase shift is between −75° and 75°.

8. The electronic device as claimed in claim 6, wherein the hybrid coupler is a 90° hybrid coupler.

9. The electronic device as claimed in claim 6, further comprising:
an adjusting circuit coupled to the hybrid coupler, and configured to provide to the first input the analog signal, and the processing circuit a setpoint signal having a setpoint phase;
wherein the processing circuit is further configured to:
compare the setpoint phase and the calculated phase of the analog signal; and
in response to the setpoint phase and the calculated phase of the analog signal being different, adjust the phase of the analog signal via the adjusting circuit until the setpoint phase and the calculated phase of the analog signal are equal to within a tolerance.

10. The electronic device as claimed in claim 9, wherein the adjusting circuit comprises an emitting module configured to:

provide the analog signal; and
adjust, under control of the processing circuit, the phase of the analog signal based on the setpoint phase.

11. The electronic device as claimed in claim 9, wherein the adjusting circuit comprises:
an emitting module configured to provide the setpoint signal and the analog signal; and
a phase shifter coupled between the emitting module and the first input, and configured to adjust, under control of the processing circuit, the phase of the analog signal based on the setpoint phase.

12. The electronic device as claimed in claim 6, wherein the tolerance is 5%.

13. An apparatus, comprising:
an electronic device, comprising:
a hybrid coupler configured to operate in power-combiner mode, the hybrid coupler comprising:
a first input configured to receive an analog signal having a frequency;
a second input configured to receive a reference signal having the frequency and a reference phase; and
two outputs configured to generate a first output signal and a second output signal, respectively;
a measuring circuit configured to measure peak values of the analog signal, the reference signal, and at least one of the first output signal and the second output signal;
an adjusting circuit coupled to the hybrid coupler, and configured to provide to the first input the analog signal, and a processing circuit a setpoint signal having a setpoint phase;
the processing circuit, configured to:
calculate a phase shift between the analog signal and the reference signal from the measured peak values;
calculate a phase of the analog signal from the calculated phase shift and the reference phase;
compare the setpoint phase and the calculated phase of the analog signal; and
in response to the setpoint phase and the calculated phase of the analog signal being different, adjust the phase of the analog signal via the adjusting circuit until the setpoint phase and the phase of the analog signal are equal to within a tolerance;
an output device comprising a complementary hybrid coupler configured to operate in power-combiner mode; and
a coupling stage coupled between the electronic device and the output device.

14. The apparatus as claimed in claim 13, wherein the apparatus is a communication apparatus.

15. The apparatus as claimed in claim 13, wherein the hybrid coupler has a coupling factor value of between 0.8 and 1.0, and the calculated phase shift is between −75° and 75°.

16. The apparatus as claimed in claim 15, wherein the hybrid coupler is a 90° hybrid coupler.

17. The apparatus as claimed in claim 13, wherein the adjusting circuit comprises an emitting module configured to:
provide the analog signal; and
adjust, under control of the processing circuit, the phase of the analog signal based on the setpoint phase.

18. The apparatus as claimed in claim 13, wherein the adjusting circuit comprises:
an emitting module configured to provide the setpoint signal and the analog signal; and a phase shifter coupled between the emitting module and the first input, and configured to adjust, under control of the processing circuit, the phase of the analog signal based on the setpoint phase.

19. The apparatus as claimed in claim 13, further comprising an antenna coupled to the output device.

20. The apparatus as claimed in claim 13, wherein the tolerance is 5%.

* * * * *